United States Patent [19]
Okino

[11] Patent Number: 5,144,631
[45] Date of Patent: Sep. 1, 1992

[54] SEMICONDUCTOR LASER DRIVE DEVICE

[75] Inventor: Yoshiharu Okino, Kanagawa, Japan

[73] Assignee: Fuji Photo Film Co., Ltd., Kanagawa, Japan

[21] Appl. No.: 643,241

[22] Filed: Jan. 18, 1991

[30] Foreign Application Priority Data

Jan. 22, 1990 [JP]  Japan .................................. 2-13026

[51] Int. Cl.[5] ............................................... H01S 3/10
[52] U.S. Cl. ........................................ 372/25; 372/26; 372/38
[58] Field of Search ............................ 372/25, 38, 26; 346/76 L; 364/519

[56] References Cited

U.S. PATENT DOCUMENTS

| 4,601,037 | 7/1986 | McDonald | 372/25 |
| 4,679,057 | 7/1987 | Hamada | 346/76 L |
| 5,029,108 | 7/1991 | Lung | 364/519 |

FOREIGN PATENT DOCUMENTS 59-119960  7/1984  Japan .

Primary Examiner—Georgia Y. Epps
Attorney, Agent, or Firm—Sughrue, Mion, Zinn, Macpeak & Seas

[57] ABSTRACT

A semiconductor laser drive device includes a pulse-width modulation circuit for producing a pulse-width-modulated signal having a first number of gradations in response to a first image signal, and a pulse-amplitude modulation circuit for producing a pulse-amplitude-modulated signal having a second number of gradations in response to a second image signal, the pulse-amplitude-modulated signal having an amplitude of zero when the semiconductor laser radiates no emission and having an amplitude for maintaining a predetermined emission mode from the semiconductor laser when the semiconductor laser radiates the emission. The semiconductor laser is supplied with a signal having a number of gradations determined by a combination of the pulse-width-modulated signal and the pulse-amplitude-modulated signal.

7 Claims, 9 Drawing Sheets

FIG.3

| $S_2$ | Sm (mA) | Sm+1 (mA) |
|---|---|---|
| 0 | 0 | 55 |
| 1 | 55 | 55.24 |
| 2 | 55.24 | 55.48 |
| 3 | 55.48 | 55.71 |
| ⋮ | ⋮ | ⋮ |
| 62 | 69.76 | 70 |
| 63 | 70 | 70.24 |

| $S_1$ | Tn (ns) | Tn' (ns) |
|---|---|---|
| 0 | 400 | 0 |
| 1 | 393.7 | 6.3 |
| 2 | 387.3 | 12.7 |
| 3 | 381.0 | 19.0 |
| ⋮ | ⋮ | ⋮ |
| 62 | 6.3 | 393.7 |
| 63 | 0 | 400 |

| $S_1$ | Tn (ns) | Tn' (ns) |
|---|---|---|
| 0 | 380 | 0 |
| 1 | 374 | 6 |
| 2 | 368 | 12 |
| 3 | 362 | 18 |
| ⋮ | ⋮ | ⋮ |
| 62 | 6 | 374 |
| 63 | 0 | 380 |

~110

SEMICONDUCTOR LASER DRIVE DEVICE

BACKGROUND OF THE INVENTION

1. Field of the Invention

The present invention relates to a device for driving a semiconductor laser which is used to record image information on a photographic film or the like.

2. Prior Art

As is well known the art, an image may be recorded on an image recording medium using a laser beam which is modulated by an image signal that represents the image. Generally, there are two methods of modulating the intensity of the laser beam with the image signal. According to one method, the intensity of the laser beam is modulated by varying the magnitude of an electric current supplied as the image signal to the semiconductor laser. This method is referred to as a pulse amplitude modulation process. The other method varies the period of time in which the electric current is supplied to the semiconductor laser, thus modulating the laser beam intensity. The latter method is referred to as a pulse width modulation process.

In order to obtain a multiplicity of image gradations on the photographic film through only the pulse amplitude modulation process, it is necessary to utilize spontaneous emission of the semiconductor laser. However, the focused spot of the laser beam on the photographic film tends to be distorted.

For producing multiple image gradations through only the pulse width modulation process, since it is necessary to reproduce a highlight area on a negative photosensitive medium in a range of gradations, the intensity of the emitted laser beam needs to be controlled stably in a low intensity range. Stated otherwise, narrow pulses of the current supplied to the semiconductor laser are required to be controlled stably. Such stable intensity control, however, is practically infeasible since it can be achieved only when the semiconductor laser drive device incorporates expensive circuit components.

In view of the above drawbacks, the applicant has proposed a technical approach to the generation of multiple image gradations as disclosed in Japanese Laid-Open Patent Publication No. 59(1984)-119960. The disclosed solution makes it possible to modulate the intensity of a laser beam for a range of image gradations through a combination of the pulse amplitude modulation process and the pulse width modulation process.

SUMMARY OF THE INVENTION

It is an object of the present invention to provide a device for driving a semiconductor laser to modulate the intensity of an emitted laser beam, which consists of only stimulated emission rather than spontaneous emission, with a combination of pulse amplitude and width modulation processes, so that the beam spot on a negative photosensitive medium is stable in configuration and highlights on the negative photosensitive medium are reproduced in gradations which are smooth in continuity.

According to the present invention, there is provided a device for driving a semiconductor laser, comprising a pulse-width modulation circuit for producing a pulse-width-modulated signal having a first number of gradations in response to a first image signal, a pulse-amplitude modulation circuit for producing a pulse-amplitude-modulated signal having a second number of gradations in response to a second image signal, the pulse-amplitude-modulated signal having an amplitude of zero when the semiconductor laser radiates no emission and having an amplitude for maintaining a predetermined emission mode from the semiconductor laser when the semiconductor laser radiates the emission, and a combining circuit for supplying the semiconductor laser with an output signal having a number of gradations determined by a combination of the pulse-width-modulated signal and the pulse-amplitude-modulated signal.

The pulse-width modulation circuit comprises means for producing a pulse-width-modulated signal representative of first and second exposure times which are equal to or shorter than the period of each of a plurality of pixels which are to be produced by the emission of the semiconductor laser, and wherein the pulse-amplitude-modulation circuit comprises means for producing a pulse-amplitude-modulated signal having first and second amplitudes, the arrangement being such that the semiconductor laser is energized with the first amplitude during the first exposure time and with the second amplitude during the second exposure time.

The pulse-width modulation circuit comprises a lookup table for storing data on a period of time for which the semiconductor laser radiates the emission, in relation to the first image signal, a D/A converter for converting the data stored in the lookup table into an analog signal, a sawtooth generator for generating a sawtooth signal, and a comparator for comparing the levels of the analog signal and the sawtooth signal to produce the pulse-width-modulated signal. The lookup table stores data on a period of time for which the semiconductor laser radiates the emission without mode hopping and on a quiescent period of time following the period of time.

The pulse-amplitude modulation circuit has a lookup table for storing data on an electric current for driving the semiconductor laser, in relation to the second image signal.

The combining circuit comprises a switch for controlling the width of a pulse of the pulse-amplitude-modulated signal based on the pulse-width-modulated signal.

The semiconductor laser drive device further includes a lookup table connected to input terminals of the pulse-width modulation circuit and the pulse-amplitude modulation circuit, for producing the first and second image signals, the first and second image signals representing a predetermined gradation level, among a plurality of gradation levels stored in the lookup table, depending on the density level of an image signal applied to the lookup table and pixel position data on the position of a pixel represented by the image signal.

The above and other objects, features and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 3 is a table showing the relationship between a second signal and amplitude-modulated signals;

FIG. 4 is a table showing the relationship between a first signal and exposure times;

FIG. 7 is a table showing the relationship between a first signal and exposure times according to a modification;

DETAILED DESCRIPTION OF THE PREFERRED EMBODIMENTS

Figure 1:
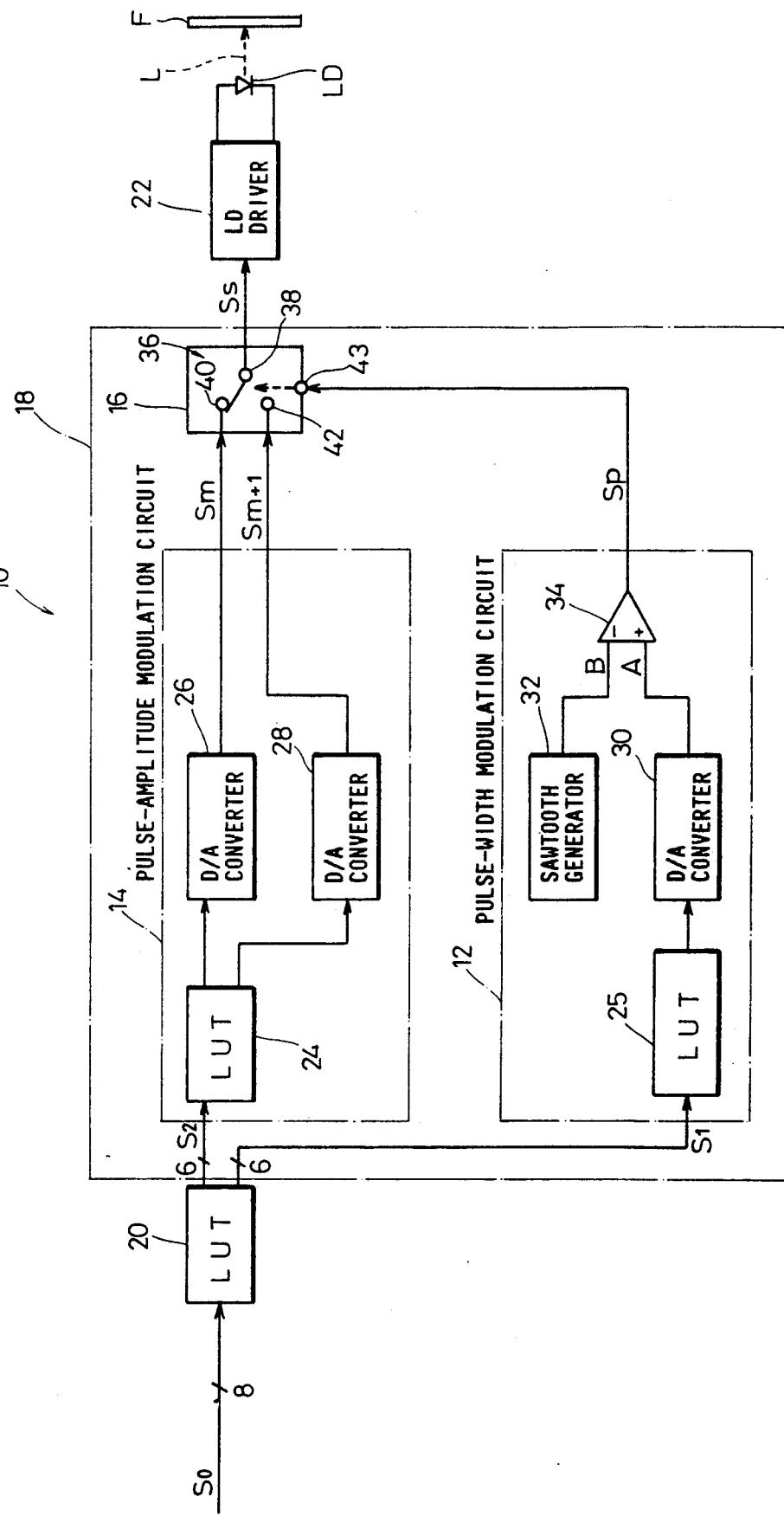
FIG. 1 is a block diagram of an exposure apparatus which incorporates a device for driving a semiconductor laser according to an embodiment of the present invention.

FIG. 1 shows an exposure apparatus, generally designated by the reference numeral 10, which incorporates a device for driving a semiconductor laser according to an embodiment of the present invention.

The exposure apparatus 10 includes a semiconductor laser drive device 18 which comprises a pulse-width modulation circuit 12 for producing a width-modulated signal Sp in response to a first digital image signal S1 which has been corrected, an amplitude modulation circuit 14 for producing an amplitude-modulated signal Sm and an amplitude-modulated signal Sm+1 in response to a second digital image signal S2 which has been corrected, and a combining circuit 16 for combining the width-modulated signal Sp and the amplitude-modulated signals Sm, Sm+1 into a combined signal Ss which has been both width- and amplitude-modulated.

The semiconductor laser drive device 18 has an input terminal connected to a lookup table (LUT) 20 which produces the first and second digital image signals S1, S2, each of 6 bits, in response to an 8-bit digital image signal S0. The LUT 20 converts the 8-bit digital image signal S0 into the 6-bit first and second digital image signals S1, S2 for gamma ($\gamma$) correction. The semiconductor laser drive device 18 also has an output terminal connected to a laser diode (LD) driver 22 for driving a semiconductor laser in the form of a laser diode LD n response to the combined signal Ss. An output laser beam L which is emitted from the laser diode LD in response to the combined signal Ss is applied to a photographic film F.

The pulse-width modulation circuit 12 comprises a LUT 25, a D/A converter 30, a sawtooth generator 32, and a comparator 34. The pulse-amplitude modulation circuit 14 comprises an LUT 24 and two D/A converters 26, 28.

The combining circuit 16 comprises an analog switch, for example, having a common terminal 38, a pair of terminals 40, 42, and a control terminal 43. The common terminal 38 is connected to the LD driver 22. The terminals 40, 42 are connected respectively to the D/A converters 26, 28. The control terminal 43 is connected to the comparator 34. The common terminal 38 can selectively be connected to the terminal 42 when the width-modulated signal Sp supplied to the control terminal 43 is high in level and to the terminal 40 when the width-modulated signal Sp supplied to the control terminal 43 is low in level.

Figure 2:
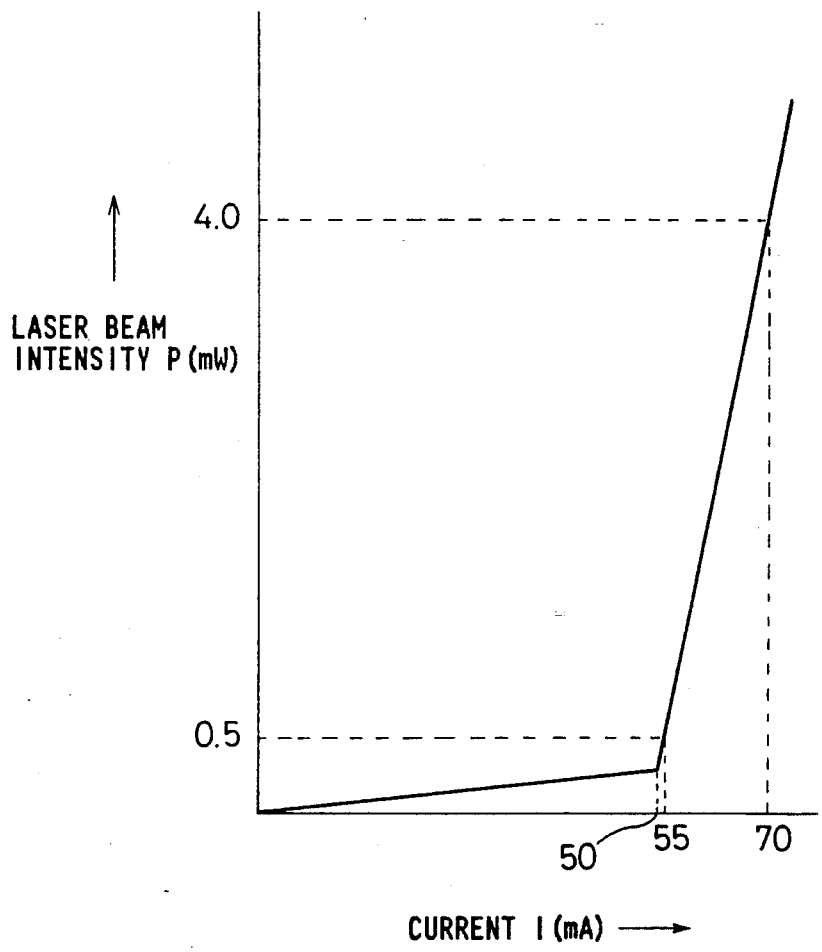
FIG. 2 is a graph showing the relationship between an electric current supplied to a laser diode and the intensity of a laser beam emitted by the laser diode.

The laser diode LD has a current vs. intensity characteristic curve as shown in FIG. 2. The laser diode LD operates in a spontaneous emission region when an electric current I supplied to the laser diode LD is smaller than 50 mA, and in a stimulated emission region when the electric current I is equal to or greater than 50 mA. In the illustrated embodiment, the electric current I is selected to be in the range from 55 mA to 70 mA in order to cause the laser diode LD to emit a laser beam which has an intensity in the range from 0.5 mW to 4 mW.

The electric current I supplied to the laser diode LD is produced by the LD driver 22 when it amplifies the combined signal Ss. The amplitude of the combined signal Ss is determined by the amplitude-modulated signals Sm, Sm+1. The amplitude-modulated signals Sm, Sm+1 are analog signals which are produced by the respective D/A converters 26, 28 when they convert digital data stored in the LUT 24. The LUT 24 store digital data for generating the amplitude-modulated signals Sm, Sm+1 corresponding to the electric current I.

Values of the amplitude-modulated signals Sm, Sm+1 corresponding to values of the second signal S2 are stored as a pulse amplitude table 50 in the LUT 24, as shown in FIG. 3. More specifically, the values of each of the amplitude-modulated signals Sm, Sm+1 correspond to a first number of gradations, i.e., 64 gradations, and are stored as data for producing values of the current I which are 0, 55, 55+(70-55)/63, ..., 70, 70.24($\approx$0, 55, 55.24, ..., 69.76, 70, 70.24) in response to respective values of the second digital image signal S2 which are 0, 1, 2 ..., 63. The amplitude-modulated signals Sm, Sm+1 are related to each other such that the value of the amplitude-modulated signal Sm at the time the second signal S2 has a value of 3 is the same as the value of the amplitude-modulated signal Sm+1 at the time the second signal S2 has a value of 2, for example. Therefore, the values of the amplitude-modulated signals Sm+1 are 0.24 greater than the corresponding values of the amplitude-modulated signals Sm. When the second signal S2 has a value of 0, the amplitude-modulated signal Sm has a value of 0 mA in FIG. 3, but may have a very weak current of 10 mA or less which is not effective to develop any color on the photographic film F.

The width-modulated signal Sp has values corresponding to a second number of gradations, i.e., 64 gradations, and is used to determine an exposure time Tn in which the photographic film F is to be exposed to the laser beam L produced in response to the amplitude-modulated signal Sm and also an exposure time Tn' in which the photographic film F is to be exposed to the laser beam L produced in response to the amplitude-modulated signal Sm+1. The values of the width-modulated signal Sp, as related to respective values of the first digital image signal S1, which are 0, 1, 2, ..., 63, are stored as a pulse width table 52 in the LUT 25, as shown in FIG. 4.

In the illustrated embodiment, the sum of the exposure times (Tn+Tn') per pixel on the photographic film F is selected to be 400 ns. Each of the exposure times Tn, Tn' has values of 0, (400/63)≈6.3, 12.7, ..., 393.7, 400 in order to switch over the common terminal 38 of the analog switch 36 to the terminal 40 (corresponding to the exposure time Tn) or to the terminal 42 (corresponding to the exposure time Tn') in response to the first digital image signal S1.

The exposure apparatus 10 which incorporates the semiconductor laser drive device 18 is controlled for synchronized operation based on a line synchronizing signal and a pixel synchronizing signal whose period is 400 ns, which are produced by a control circuit (not shown).

The exposure apparatus 10 with the semiconductor laser drive device 18 incorporated therein is basically constructed as described above. Operation of the exposure apparatus 10 will be described below.

The 8-bit digital image signal S0 is supplied from the non-illustrated control circuit to the LUT 20. The 8-bit image signal S0 is processed in the LUT 20 for gamma (γ) correction with respect to the photographic film F, and thereafter is divided into the first and second digital image signals S1, S2. The first digital image signal S1 is supplied to the LUT 25 of the pulse-width modulation circuit 12. The pulse width table 52 in the LUT 25 converts the value of the first digital image signal S1 into the corresponding data on the exposure time Tn, and the exposure time Tn data are supplied to the D/A converter 30. The D/A converter 30 then converts the exposure time Tn data into the analog image signal A, shown in FIG. 5 at (a), which is applied to one input terminal of the comparator 34.

Figure 5:
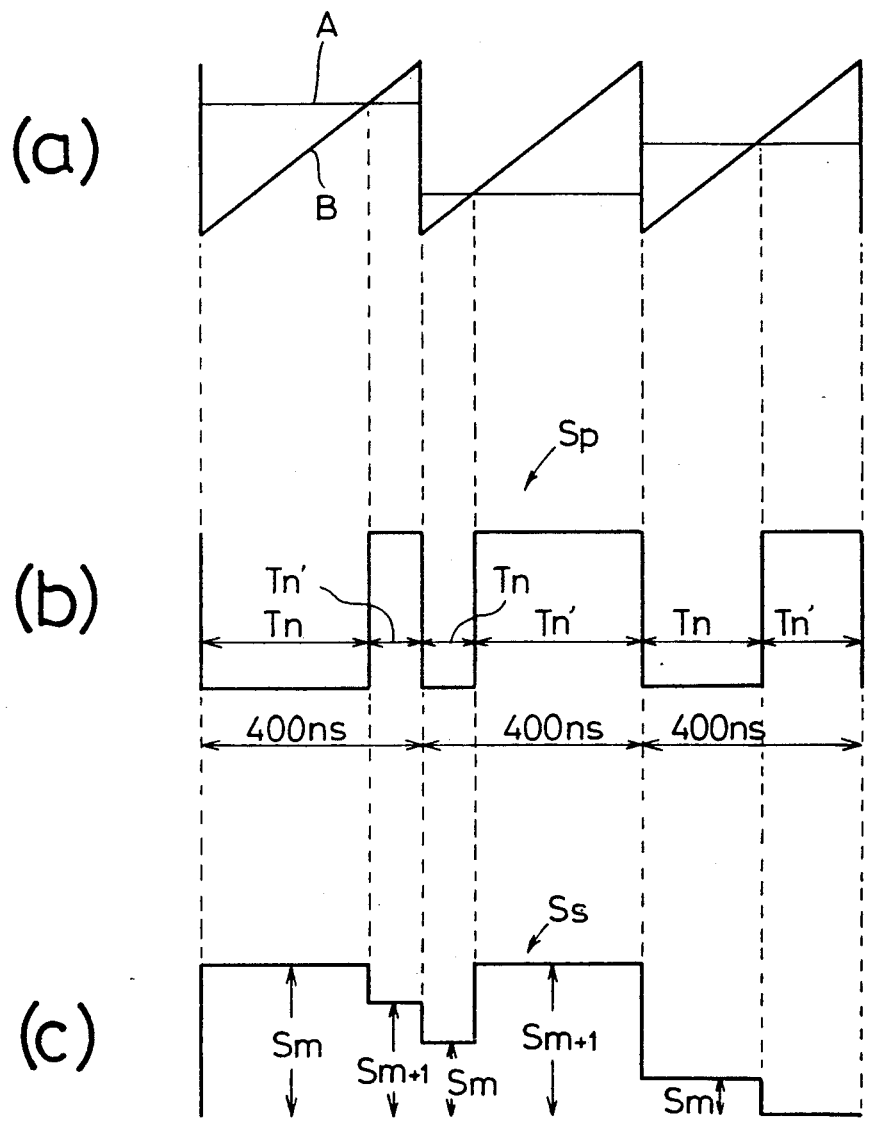
FIGS. 5a–5c are diagrams of signal waveforms illustrative of the manner in which the exposure apparatus shown in FIG. 1 operates.

The other input terminal of the comparator 34 is supplied with a sawtooth signal B, shown in FIG. 5 at (a), from the sawtooth generator 32. The sawtooth signal B has a period which is the same as the period of the pixel synchronizing signal (not shown). The comparator 34 produces the width-modulated signal Sp which has a pulse width commensurate with the level of the analog image signal A as shown in FIG. 5 at (b). The width-modulated signal Sp is therefore a binary signal whose pulse width is modulated.

The width-modulated signal Sp is then applied to the control terminal 43 of the combining circuit 16. As described above, the common terminal 38 of the analog switch 36 is connected to the terminal 40 while the width-modulated signal Sp is of a low level, and to the terminal 42 while the width-modulated signal Sp is of a high level. Therefore, the combined signal Ss from the combining circuit 16 is composed of, as shown in FIG. 5 at (c), the amplitude-modulated signal Sm which is applied to the LD driver 22 during the exposure time Tn in which the width-modulated signal Sp is of the low level, and the amplitude-modulated signal Sm+1 which is applied to the LD driver 22 during the exposure time Tn' in which the width-modulated signal Sp is of the high level.

The intensity SL of a laser beam L which is generated by the laser diode LD in response to the combined signal Ss applied to the LD driver 22 is expressed according to the following equation:

$$SL = (Sm \times Tn) + (Sm+1 \times Tn').$$

The number of gradations which can be achieved by the combined signal Ss is $64 \times (64-1)+1$. Generally, the number of gradations which can be achieved by the combined signal Ss is given as $n1 \times (n2-1)$ where n1 is the number of gradations represented by the first signal S1 and n2 is the number of gradations represented by the second signal S2.

In response to the output signal from the LD driver 22 based on the combined signal Ss, the laser diode LD is energized to apply the laser beam to the photographic film L F for thereby recording an image represented by the image signal S0 on the photographic film F.

As shown in FIGS. 3 and 4, except when the values of the first and second signals S1, S2 are 0, i.e., when the laser diode LD does not generate any laser beam, the laser diode LD is controlled to radiate stimulated emission. Consequently, the spot of the laser beam L focused on the photographic film F is stable in configuration. The image recorded on the photographic film F is of multiple gradations because the pulse-width modulation circuit 12 and the pulse-amplitude modulation circuit 14 are employed.

Figure 6:
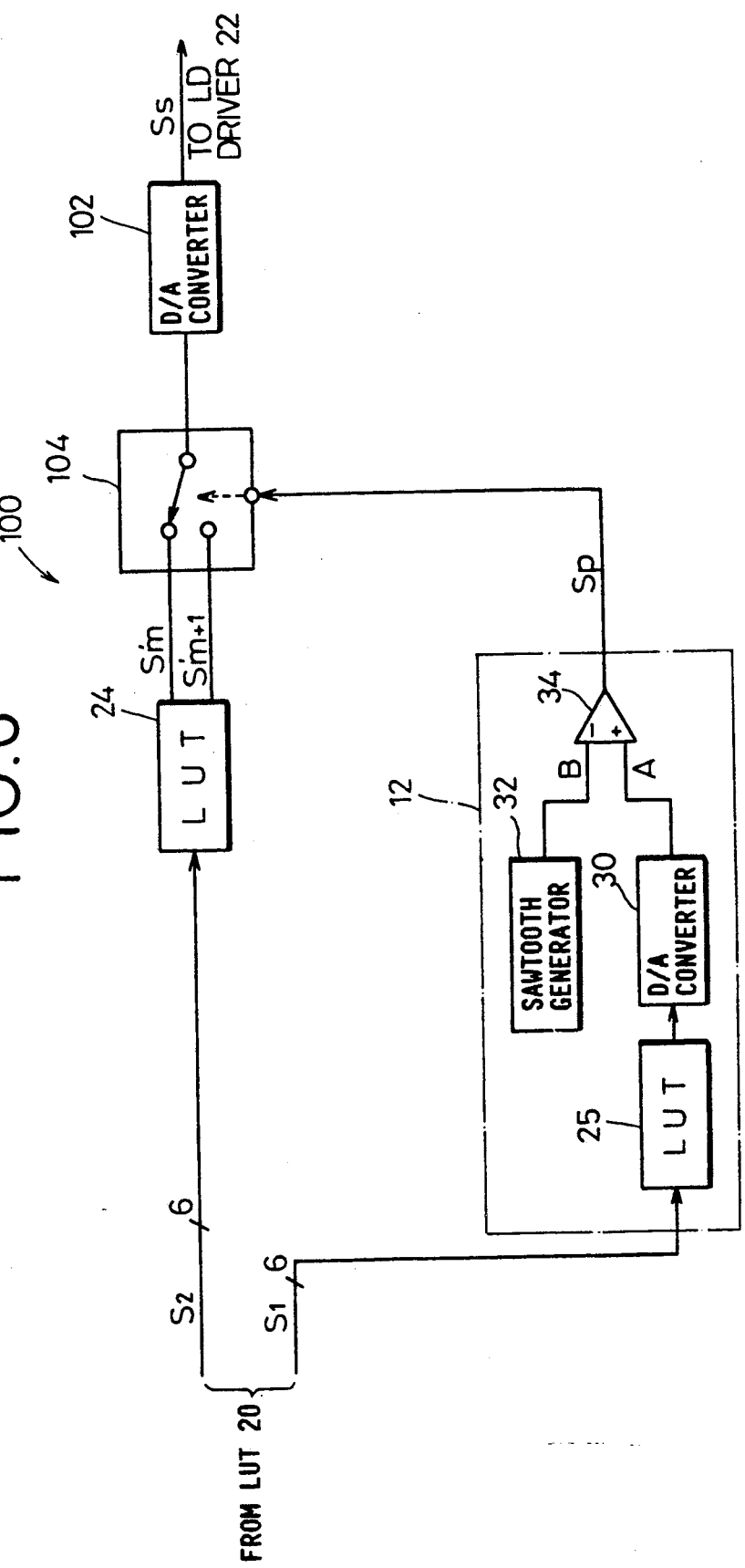
FIG. 6 is a block diagram of a device for driving a semiconductor laser according to another embodiment of the present invention.

FIG. 6 shows a semiconductor laser drive device 100 according to another embodiment of the present invention. Those parts of the semiconductor laser drive device 100 which are identical to those of the semiconductor laser drive device 18 shown in FIG. 1 are denoted by identical reference numerals, and will not be described below.

The semiconductor laser drive device 100 employs a high-speed D/A converter 102 which can operate at a higher speed than the D/A converters 26, 28 shown in FIG. 1. Digital amplitude-modulated signals S'm, S'm+1 from the LUT 24 are switched over by an electronic switch 104, and converted into an analog combined signal Ss by the D/A converter 104. The circuit arrangement of the semiconductor laser drive device 100 is thus simpler than that of the semiconductor laser drive device 18 shown in FIG. 1.

In the above embodiments, the period of the pixel synchronizing signal is the same as the total exposure time Tn+Tn'. In order to minimize mode hopping which is caused by the self-heating of the laser diode LD, the LUT 25 may store a pulse width table 100 as shown in FIG. 7 in which the total exposure time Tn+Tn' is 380 ns, providing a quiescent time of 20 ns between adjacent pixels.

According to a further embodiment, in order to maintain the intensity of the laser beam generated by the laser diode LD at a constant level, the semiconductor laser drive device may incorporate an APC (automatic power control) system for updating the values of the amplitude-modulated signal Sm+1 with respect to the amplitude-modulated signal Sm or updating the values of the exposure times Tn, Tn'.

Figure 8:
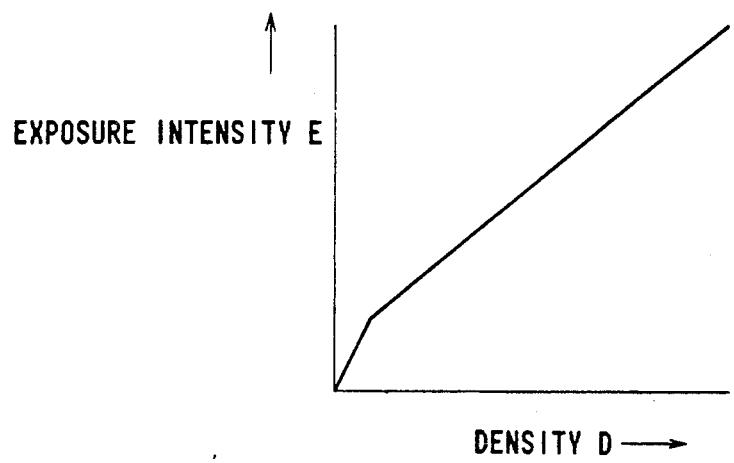
FIGS. 8 and 9 are graphs showing the relationship between the density of a recorded image and the intensity of a laser beam applied to reproduce the image.
Figure 9:
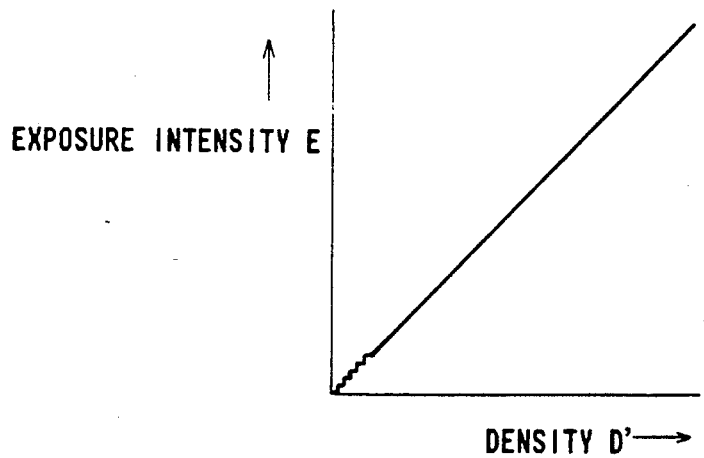

In the embodiments shown in FIGS. 1 and 6, the intensity of the laser beam L applied to the photographic film F to the laser diode LD in response to the image signal S0, i.e., the exposure intensity, varies at a higher rate in a highlight area (low-density area) as can been seen from the density D vs. exposure intensity E curve of FIG. 8. The higher-rate variation in the exposure density may be corrected by the density D' vs. exposure intensity E curve shown in FIG. 9 which may be stored in the LUT 20. However, the exposure intensity E in the highlight area varies stepwise or does not vary smoothly, and hence the gradations in the highlight area do not vary smoothly in continuity.

In general, a highlight area (low-density area) of an image does not require as much resolution, i.e., as many pixels, as in medium- and high-density areas. Therefore, the gradations in a highlight area can be rendered smoother in continuity when an intermediate density level is expressed by the average of the densities of a plurality of pixels.

Figure 10:
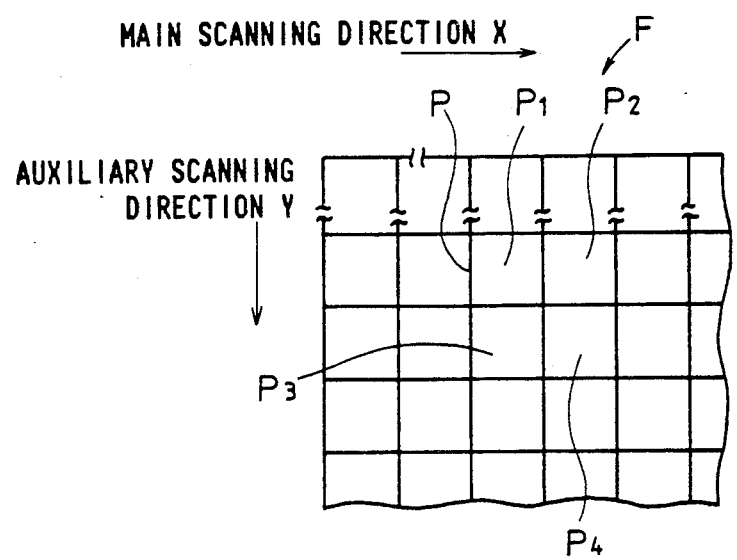
FIG. 10 is a fragmentary diagram showing pixels on a photographic film.
Figure 11:
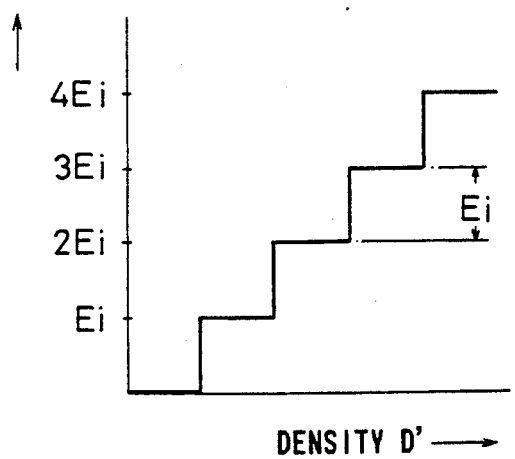
FIG. 11 is a graph showing, on an enlarged scale, a low-density region of the density-intensity curve shown in FIG. 9.

A process of increasing the continuity of the gradations will be described below with respect to the photographic film F on which pixels are divided in main and auxiliary scanning directions X, Y as shown in FIG. 10. FIG. 11 shows, at an enlarged scale, the portion in a highlight area of the density D' vs. exposure intensity E curve shown in FIG. 9. As can be seen from FIG. 11, the exposure intensity E varies in successive steps each having an intensity level Ei.

As shown in FIG. 10, the pixels on the photographic film F are divided into groups of adjacent four pixels P= P1, P2, P3, P4. The LUT 20 is arranged such that the density D achieved by the exposure intensity E looks on the photographic film F as if it varies by the groups of four pixels P with respect to highlight areas.

Figure 12:
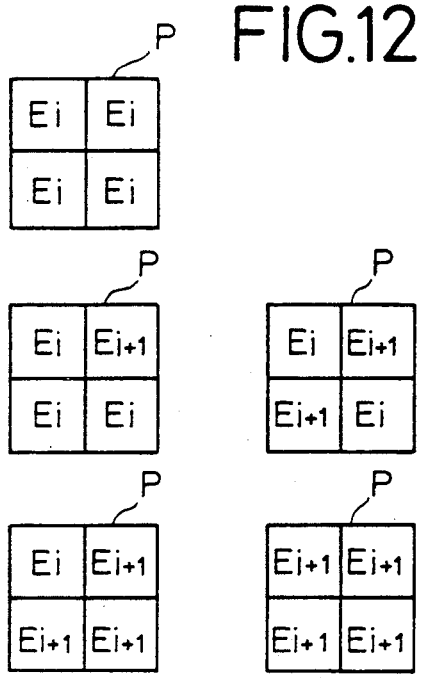
FIG. 12 is a diagram illustrative of the manner in which an image is recorded by groups of four pixels.

FIG. 12 shows some groups of four pixels P. The pixel groups P shown in FIG. 12 have different densities, when viewed as a whole, which are produced according to different exposure intensities. Actually, the illustrated pixel groups have successively increasing densities produced according to successively increasing exposure intensities.

Figure 13:
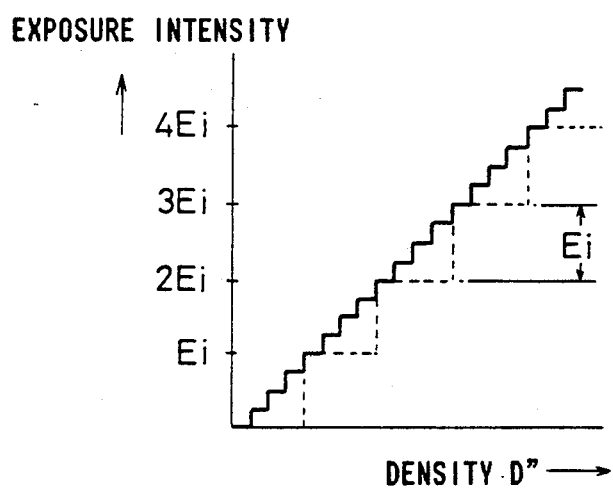
FIG. 13 is a graph showing the manner in which the number of gradations is increased in a low-density region.

FIG. 13 shows a density D'' vs. exposure intensity E curve potted at the time the exposure intensity E varies by the groups of four pixels P. As shown in FIGS. 12 and 13, the exposure intensity E for the group of four pixels P varies in successive steps each having an intensity level of Ei/4 because each intensity level Ei shown in FIG. 11 is divided into four intensity sublevels of Ei, $(Ei+Ei+Ei+2Ei)/4=1.25Ei$, $(Ei+Ei+2Ei+2Ei)/4=1.5Ei$, $(Ei+2Ei+2Ei+2Ei)/4=1.75Ei$.

While a highlight area expressed by the groups of four pixels P whose density is thus controlled is of lower resolution, the continuity of the gradations of the highlight are is rendered smoother.

Figure 14:
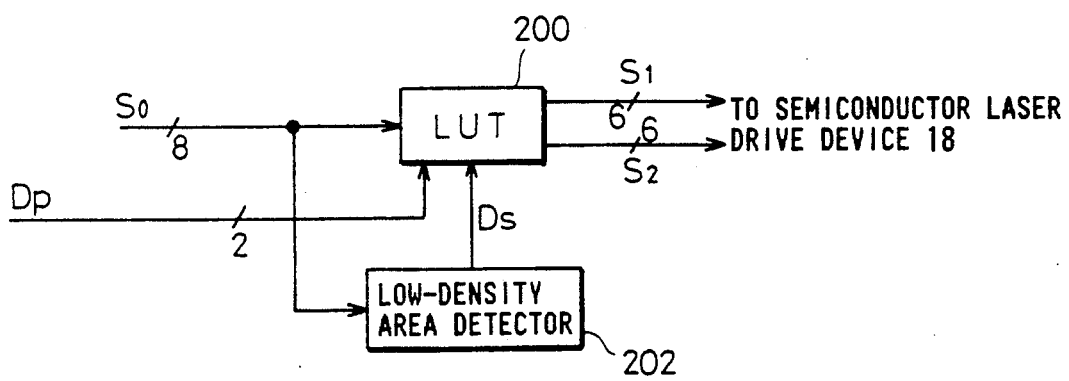
FIG. 14 is a block diagram of a circuit arrangement for increasing the number of gradations in a low-density region.

FIG. 14 shows in block form a circuit arrangement for carrying out the process of increasing the continuity of gradations in a highlight or low-density area. Those components shown in FIG. 14 which are identical to those parts shown in FIG. 1 are denoted by identical reference numerals, and will not be described in detail. A low-density area detector 202 detects a low-density or highlight area depending on the density level of the image signal S0. When a low-density area is detected, the low-density area detector 202 applies a selection signal Ds to a LUT 200 which produces the first and second digital image signals S1, S2 based on pixel position data Dp. The pixel position data Dp specify the addresses of the four adjacent pixels P=P1, P2, P3, P4.

The circuit arrangement shown in FIG. 13 allows the exposure intensity E to be controlled in smaller intensity levels in highlight areas, as shown in FIG. 13. As a result, the gradations of a recorded image are rendered smoother in continuity.

The circuit arrangement shown in FIG. 14 will be described in more detail. The first and second digital image signals S1, S2 which are produced by the LUT 200 are representative of a gradation level among a plurality of gradation levels stored in the LUT 200, depending on the density level of the image signal S0 applied to the LUT 200 and the pixel position data Dp also applied to the LUT 200. The density level of the image signal S0 is detected by the low-density detector 202.

With the present invention, as described above, when the semiconductor laser is driven by the pulse-width modulation circuit and the pulse-amplitude modulation circuit, the stimulated emission of the semiconductor laser is utilized at all times. Therefore, the beam spot configuration of the laser beam on the negative photosensitive medium, i.e., the photographic film, is stable. The semiconductor laser drive device according to the present invention also controls the laser beam of the semiconductor laser such that the gradations in a highlight area on the negative photosensitive medium are smoother in continuity.

Although certain preferred embodiments have been shown and described, it should be understood that many changes and modifications may be made therein without departing from the scope of the appended claims.

What is claimed is:

1. A device for driving a semiconductor laser, comprising:
   a pulse-width modulation circuit for producing a pulse-width-modulated signal having a first number of gradations in response to a first image signal;
   a pulse-amplitude modulation circuit for producing a pulse-amplitude-modulated signal having first and second amplitudes and having a second number of radiations in response to a second image signal, wherein said first and second amplitudes of said pulse-amplitude-modulated signal are zero when the semiconductor laser radiates no emission and sufficient for maintaining a predetermined emission mode from the semiconductor laser when the semiconductor laser radiates the emission; and
   a combining circuit for supplying the semiconductor laser with an output signal having a number of gradations determined by the combination of said pulse-width-modulated signal and said pulse-amplitude-modulated signal.

2. A device according to claim 1, wherein said pulse-width modulation circuit comprises means for producing a pulse-width-modulated signal representative of first and second exposure times which are equal to or shorter than the period of each of a plurality of pixels which are to be produced by the emission of the semiconductor laser, and wherein said pulse-amplitude-modulation circuit comprises means for producing said pulse-amplitude-modulated signal having first and second amplitudes, the arrangement being such that the semiconductor laser is energized with said amplitude-modulated signal of said first amplitude during said first exposure time and with said amplitude-modulated signal of said second amplitude during said second exposure time.

3. A device according to claim 1, wherein said pulse-width modulation circuit comprises a lookup table for storing data on a period of time for which the semiconductor laser radiates the emission, in relation to said first image signal, a D/A converter for converting the data stored in said lookup table into an analog signal, a sawtooth generator for generating a sawtooth signal, and a comparator for comparing the levels of said analog signal and said sawtooth signal to produce the pulse-width-modulated signal.

4. A device according to claim 3, wherein said lookup table stores data on a period of time for which the semiconductor laser radiates the emission without mode hopping and on a quiescent period of time following said period of time.

5. A device according to claim 1, wherein said pulse-amplitude modulation circuit has a lookup table for storing data on an electric current for driving the semiconductor laser, in relation to said second image signal.

6. A device according to claim 1, wherein said combining circuit comprises a switch for controlling the width of a pulse of said pulse-amplitude-modulated signal based on said pulse-width-modulated signal.

7. A device according to claim 1, further including a lookup table connected to input terminals of said pulse-width modulation circuit and said pulse-amplitude modulation circuit, for producing said first and second image signals, said first and second image signals representing a predetermined gradation level, among a plurality of gradation levels stored in said lookup table, depending on the density level of an image signal applied to said lookup table and pixel position data on the position of a pixel represented by said image signal.

* * * * *